(12) United States Patent
Meikanda Muthu Ayyanar et al.

(10) Patent No.: US 11,256,286 B1
(45) Date of Patent: Feb. 22, 2022

(54) ELECTRONIC CIRCUIT AND METHOD FOR CLOCK SKEW-CALIBRATION

(71) Applicant: Samsung Electronics Co., Ltd., Suwon-si (KR)

(72) Inventors: Sethu Mathavan Meikanda Muthu Ayyanar, Bangalore (IN); Tamal Das, Bangalore (IN); Avneesh Singh Verma, Bangalore (IN)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/222,186

(22) Filed: Apr. 5, 2021

(30) Foreign Application Priority Data

Dec. 28, 2020 (IN) .............................. 202041056753

(51) Int. Cl.
*G06F 1/10* (2006.01)
*G06F 1/08* (2006.01)
*H03K 5/135* (2006.01)
*H03K 5/00* (2006.01)

(52) U.S. Cl.
CPC ................. *G06F 1/10* (2013.01); *G06F 1/08* (2013.01); *H03K 5/135* (2013.01); *H03K 2005/00104* (2013.01); *H03K 2005/00273* (2013.01)

(58) Field of Classification Search
CPC .. G06F 1/10; G06F 1/08; H03K 5/135; H03K 2005/00104; H03K 2005/00273
USPC ....................................................... 327/291
See application file for complete search history.

(56) References Cited

U.S. PATENT DOCUMENTS

| | | | |
|---|---|---|---|
| 5,309,111 A | 5/1994 | McNeely et al. | |
| 7,765,425 B1 | 7/2010 | Searles et al. | |
| 7,801,203 B2 | 9/2010 | Chen et al. | |
| 9,172,526 B1 | 10/2015 | Malipatil et al. | |
| 9,237,001 B1 * | 1/2016 | Song ........................ | H03K 7/08 |
| 9,602,082 B2 * | 3/2017 | Hedayati ................ | H03K 3/017 |
| 2016/0373242 A1 | 12/2016 | Mishra et al. | |
| 2020/0253520 A1 * | 8/2020 | Wang ................. | G01N 27/3271 |

OTHER PUBLICATIONS

K. L. Chan et al., "A 32.75-GB/s Voltage-Mode Transmitter With Three-Tap FFE in 16-nm CMOS," in IEEE Journal of Solid-State Circuits, vol. 52, No. 10, pp. 2663-2678, Oct. 2017.
P. Upadhyaya et al., "3.3 A 0.5-to-32.75Gb/s flexible-reach wireline transceiver in 20nm CMOS," 2015 IEEE International Solid-State Circuits Conference—(ISSCC) Digest of Technical Papers, San Francisco, CA, 2015, pp. 1-3.
J. Kim et al., "3.5 A 16-to-40Gb/s quarter-rate NRZ/PAM4 dual-mode transmitter in 14nm CMOS," 2015 IEEE International Solid-State Circuits Conference—(ISSCC) Digest of Technical Papers, San Francisco, CA, 2015, pp. 1-3.
Y. Frans et al., "3.7 A 40-to-64Gb/s NRZ transmitter with supply-regulated front-end in 16nm FinFET," 2016 IEEE International Solid-State Circuits Conference (ISSCC), San Francisco, CA, 2016, pp. 68-70.

* cited by examiner

*Primary Examiner* — Tomi Skibinski
(74) *Attorney, Agent, or Firm* — Harness, Dickey & Pierce, P.L.C.

(57) ABSTRACT

The electronic circuit for multiphase clock skew calibration of at least one example embodiment provides a novel low power solution to detect clock skew errors with very high accuracy, of the order of a few femto seconds, and corrects clock skew errors and decreases and/or minimizes high frequency jitter in a data path of the electronic circuit.

20 Claims, 9 Drawing Sheets

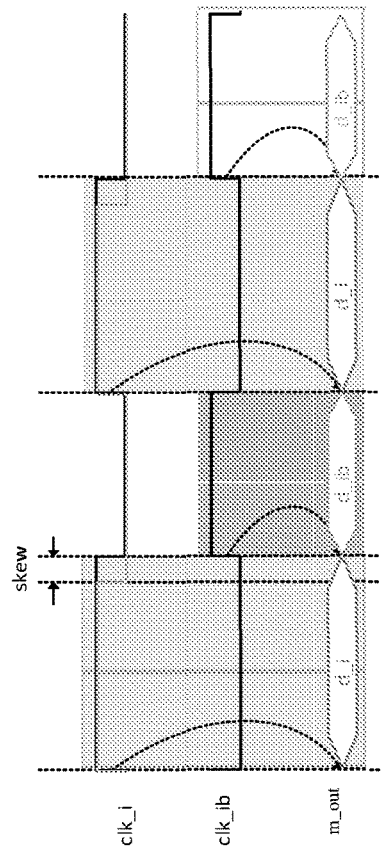
Fig. 1c
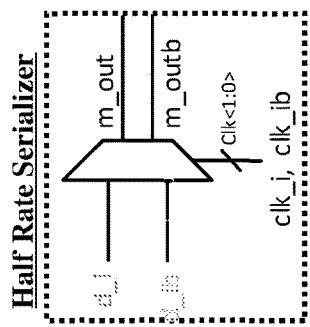
Fig. 1d
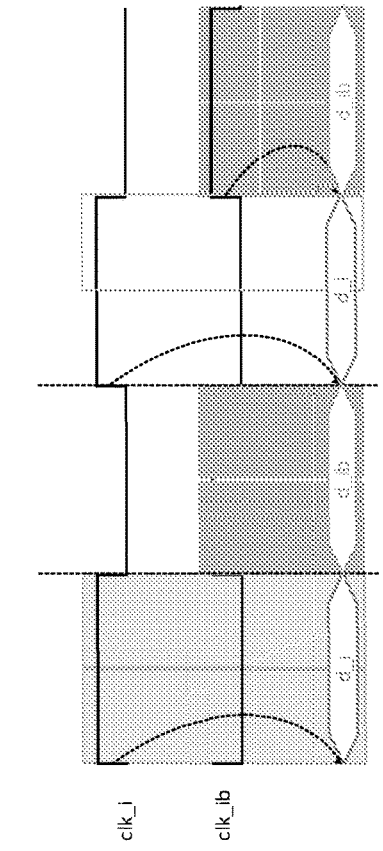
Fig. 1b
Fig. 1a

ELECTRONIC CIRCUIT AND METHOD FOR CLOCK SKEW-CALIBRATION

CROSS-REFERENCE TO RELATED APPLICATION

This U.S. non-provisional application claims the benefit of priority under 35 U.S.C. § 119 to Indian Patent Application No. 202041056753 filed on Dec. 28, 2020 in The Office of the Controller General of Patents, Designs and Trade Marks of India, the entire contents of which are herein incorporated by reference.

BACKGROUND

Various example embodiments of the inventive concepts relate to the fields of semiconductor circuits, and more particularly, to a method for clock skew detection, calibration, a circuit thereof, and/or a system thereof.

In Ultra High Speed Serializer operations, (e.g., serializer circuits that operate at >20 Gbps, etc.) the serializer or de-serializer may not work at a full clock rate of a phase locked loop (PLL) clock. For example, the serializer or de-serializer may operate at a half rate or quarter rate clock architecture because they are more robust. However, such choice comes with the cost of strobe-to-strobe error and/or skew between the clock phases. The strobe-to-strobe error or Skew between 2 half rate or 4 quarter rate clocks translates directly into high frequency jitter at the output.

FIG. 1a illustrates an example of a conventional half rate serializer and FIG. 1d illustrates a corresponding truth table for the half rate serializer of FIG. 1a. FIG. 1b illustrates a timing diagram of an Ideal 2 to 1 serialization. FIG. 1c further illustrates a non-ideal clock with skew between clocks I and IB which corresponds to a half rate serializer architecture, which in turn causes a high-frequency jitter in serial-data when using the conventional half-rate serializer. Accordingly, there lies at least a desire and/or need to reduce the amount of skew between clocks I and IB in order to be close to the ideal serialization. Skew is defined as the time interval deviation between any two specified edges of a clock signal. In an example, for a half rate configuration, the Rise-Rise skew of clocks I and IB can be defined as the deviation (e.g., difference, etc.) of the time interval from the rising edge of clock I to the rising edge of the clock IB. Likewise, the Rise-Fall skew can be defined as the deviation of the time interval from the rising edge of clock I to the falling edge of clock IB, etc. As shown in FIG. 1d, when the clock phase is in phase 1, the half rate serializer receives input clock signals clk_i and clk_ib having values of "1" and "0", respectively, and the output of the half rate serializer m_out is set to the value of the data pattern signal d_i. When the clock phase is in phase 2, the half rate serializer receives input clock signals clk_i and clk_ib having values of "0" and "1", respectively, and the output of the half rate serializer m_out is set to the value of the data pattern signal d_ib.

FIG. 2 illustrates an example conventional quadrature clock skew calibration circuit for high-speed clocking. The conventional quadrature clock skew calibration circuit is at least based on a XOR phase-detector followed by a duty cycle detection circuit. However, the offset of the amplifier and comparator limits (e.g., decreases, inhibits, etc.) the residual skew performance metric of the conventional calibration circuit. The Offset of the amplifier and comparator results in errors in detecting the direction and/or polarity of skew, which appears as residual skew at the end of the calibration of the clock skew. In addition, non-idealities of the XOR phase detector circuit further introduces error in the skew detection and limits the residual skew performance metric of the conventional calibration circuit. Moreover, duty cycle distortion in individual clocks I and Q result in incorrect IQ skew detection. Other example conventional solutions provide correction mechanism for skew using a known variable-strength buffer but remain subjected to the same limitations mentioned above.

Yet another limitation and/or drawback associated with conventional mechanisms are the use of amplifiers that lead to the addition of noise at the input of the comparator. Similar to offset, amplifier noise also affects the residual skew performance metric of the conventional calibration circuit. In respect to the configuration having multiple stages of amplification and/or multiple amplifiers, the conventional mechanisms end up adding more noise and/or consume substantially more power.

Overall, clock skew errors in high speed circuits (e.g., circuits operating at greater than 10 GHz, but not limited thereto) becomes one of the major factors that limits the performance of the circuit. For example, clock skew errors cause jitter in high speed communication circuits, which consumes a major share of the timing margin of the high speed communication circuits and affects the bit error rate (BER) of the communication system. And in circuits like high speed analog-to-digital converters (ADC), clock skew error causes non-uniform sampling and effects the linearity of the ADC circuit. Hence clock skew calibration circuits constitute an important and vital part of high speed circuits. Although clock skew errors are static or slow varying in nature, it is observed as high frequency jitter in communication circuits.

Therefore there lies a desire and/or need for a low power solution to detect clock skew errors with very high accuracy, of the order of a few femto seconds, and correct the detected clock skew errors.

There also lies a desire and/or need to decrease and/or minimize high frequency jitter in a data path, for high speed serializer-deserializer (SER-DES) circuits.

To put it differently, there lies a need of an improved mechanism that effectively detects skew, for example, down to the order of a few femto seconds, and calibrates multi-phase clock signals at least for substantially better residual skew performance in high-speed circuits (e.g., >10 GHz, etc.). Further, there lies a desire and/or need of an improved mechanism that effectively calibrates skew and is also cost-effective, has high accuracy and has low power consumption.

SUMMARY

This summary is provided to introduce a selection of concepts in a simplified format that is further described in the detailed description of the inventive concepts. This summary is not intended to identify key or essential inventive concepts of the claimed subject matter, nor is it intended for determining the scope of the claimed subject matter.

Various example embodiments of the inventive concepts refer to electronic circuits for multi-phase clock skew-calibration, systems thereof, and/or methods of operating the electronic circuit. The electronic circuit comprises a filtering circuit configured to filter data output by multi-phase clock-driven serializer circuitry, and generate a differential-voltage representative of skew between a plurality of input multi-phase clock signals to the serializer circuitry, wherein a polarity of the differential voltage represents the polarity of skew of the multi-phase clock signals, discrete time integrator circuitry configured to amplify the generated differential voltage, comparator circuitry configured to determine a divergence of the differential voltage based on the differential voltage and a desired value, and clock-skew corrector circuitry configured to modify rising edge or falling edge positions of the plurality of multi-phase clock signals based on the determined divergence, trigger the serializer circuitry to output data in accordance with the modified plurality of multi-phase clock signals, and decrease the skew between the plurality of multi-phase clock signals.

To further clarify the advantages and features of the inventive concepts, a more particular description of the inventive concepts will be rendered by reference to specific example embodiments thereof, which is illustrated in the appended drawings. It is appreciated that these drawings depict only typical example embodiments of the inventive concepts and are therefore not to be considered limiting of its scope. The example embodiments of the inventive concepts will be described and explained with additional specificity and detail with the accompanying drawings.

BRIEF DESCRIPTION OF FIGURES

These and other features, aspects, and advantages of the example embodiments of the inventive concepts will become better understood when the following detailed description is read with reference to the accompanying drawings in which like characters represent like parts throughout the drawings, wherein:

FIGS. 1A to 1C illustrate a conventional half rate serializer, ideal timing diagram, and timing diagram of the conventional half rate serializer;

FIG. 1d illustrates a truth table corresponding to the half rate serializer of FIG. 1A;

Figure 2:
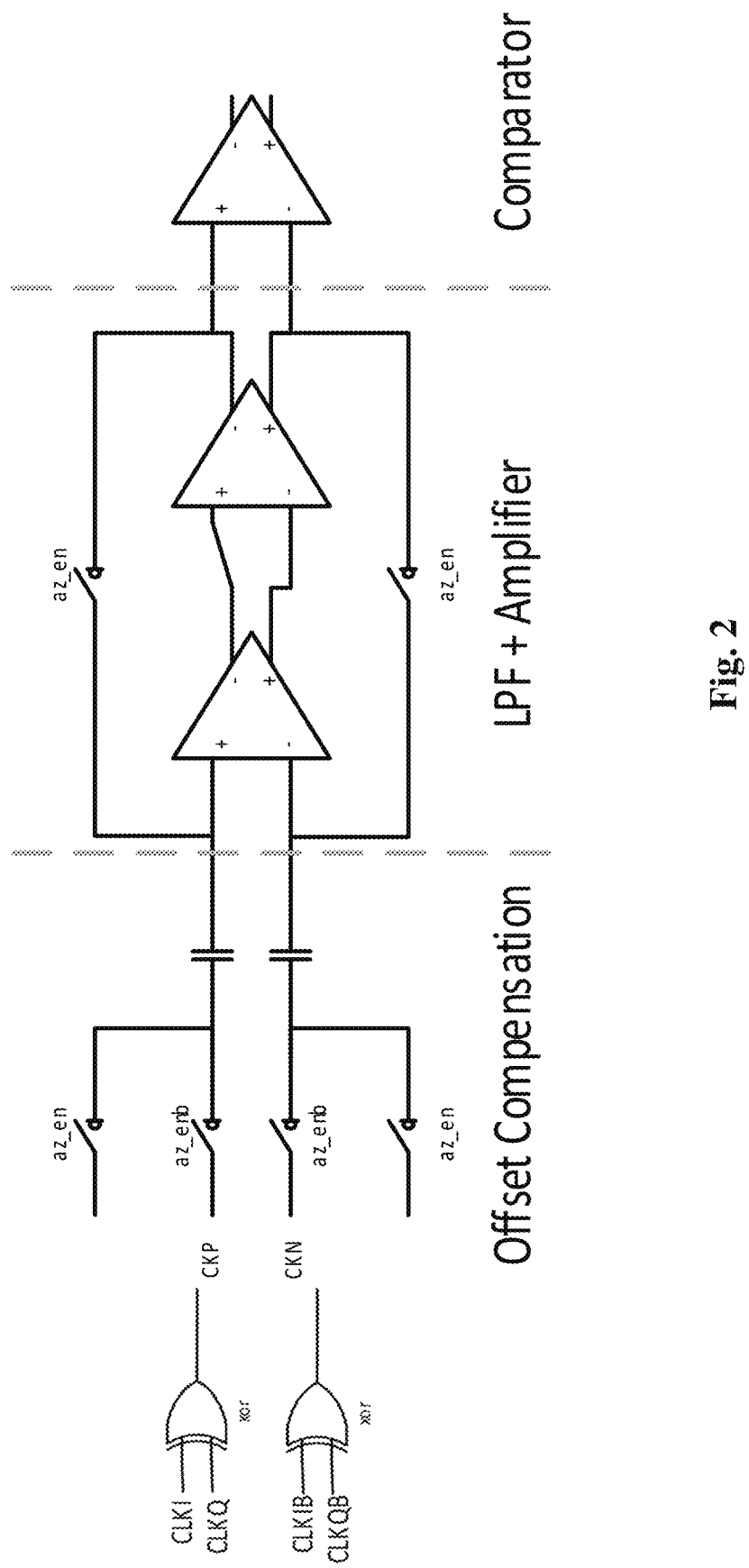
FIG. 2 illustrates a conventional clock skew calibration circuit.

Further, skilled artisans will appreciate that elements in the drawings are illustrated for simplicity and may not have been drawn to scale. For example, the flow charts illustrate the method in terms of various example operations involved to help improve understanding of aspects of at least one example embodiment of the inventive concepts. Furthermore, in terms of the construction of the device, one or more components of the device may have been represented in the drawings by conventional symbols, and the drawings may show only those specific details that are pertinent to understand the example embodiments of the inventive concepts so as not to obscure the drawings with details that will be readily apparent to those of ordinary skill in the art having benefit of the description herein.

DETAILED DESCRIPTION

For the purpose of promoting an understanding of the principles of the inventive concepts, reference will now be made to various example embodiments illustrated in the drawings and specific language will be used to describe the same. It will nevertheless be understood that no limitation of the scope of the inventive concepts is thereby intended, with alterations and further modifications in the illustrated system, and further applications of the principles of the inventive concepts as illustrated therein being contemplated as would normally occur to one skilled in the art to which the inventive concepts relates.

It will be understood by those skilled in the art that the foregoing general description and the following detailed description are explanatory of the example embodiments of the inventive concepts and are not intended to be restrictive thereof.

Reference throughout this specification to "an aspect", "another aspect" or similar language means that a particular feature, structure, or characteristic described in connection with at least one example embodiment is included in at least one example embodiment of the inventive concepts. Thus, appearances of the phrase "in an example embodiment", "in another example embodiment" and similar language throughout this specification may, but do not necessarily, all refer to the same example embodiment.

The terms "comprises", "comprising", or any other variations thereof, are intended to cover a non-exclusive inclusion, such that a process or method that comprises a list of operations does not include only those operations but may include other operations not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art. The system, methods, and examples provided herein are illustrative only and not intended to be limiting.

Various example embodiments relate to an electronic circuit, system, and/or method for performing a multi-phase clock skew-calibration based on analysing the duty cycle of the input signal (IN). The analysis of the input signal comprises investigating whether the input signal (IN) has the duty cycle greater than or less than a desired and/or certain level, for example, 50%, but not limited thereto. Further, if the duty appears to be greater than the desired level, for example, 50%, the duty of the signal is reduced. Similarly, if the duty appears to be less than the desired level, for example, 50%, then the duty of the signal is increased. However, the example embodiments are not limited thereto.

Figure 3A:
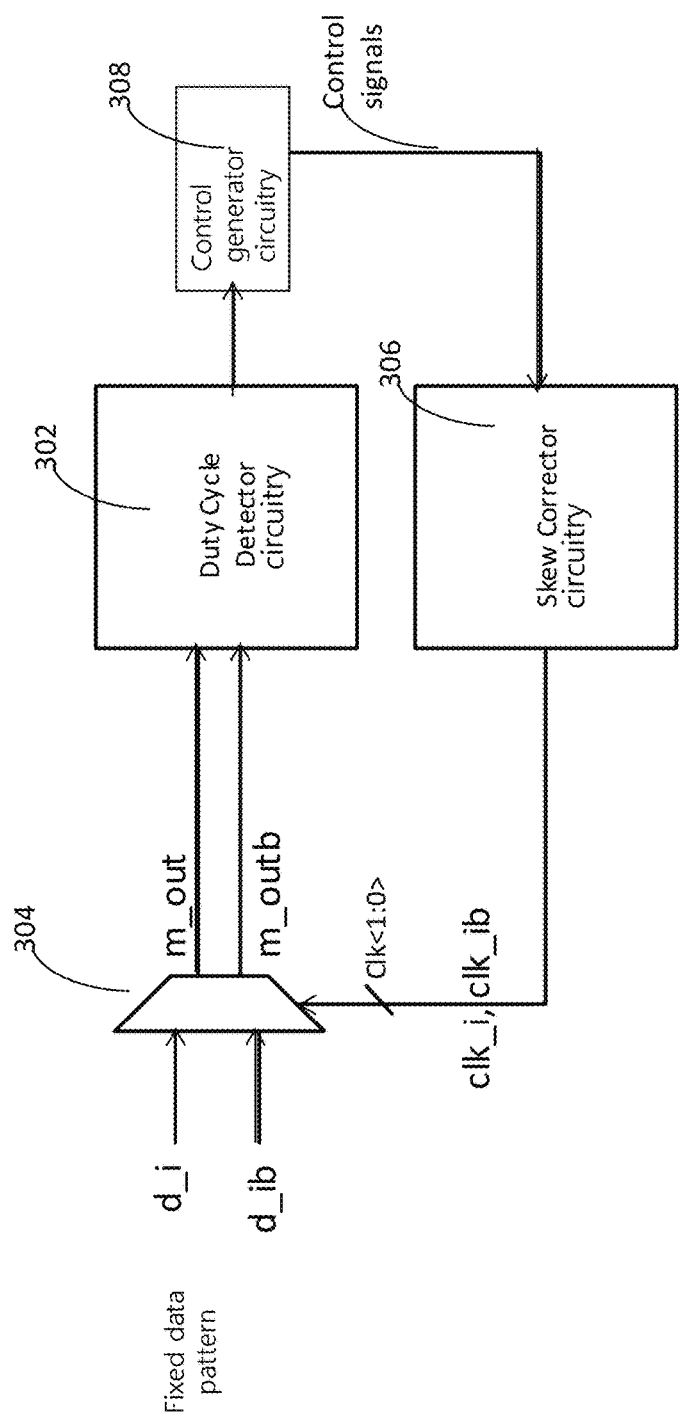
FIGS. 3A to 3B illustrate an electronic circuit for multi-phase clock skew-calibration, in accordance with at least one example embodiment of the inventive concepts.

FIG. 3a illustrates an electronic circuit 300 for multi-phase clock skew-calibration, in accordance with at least one example embodiment of the inventive concepts.

According to at least one example embodiment, an electronic circuit 300 for multi-phase clock skew-calibration comprises a duty cycle detector circuitry 302 comprising a filtering circuit (not shown) for filtering data output by a multi-phase clock-driven serializer 304, and generating a differential-voltage 'vd' representative of the skew between the plurality of input clock signals (e.g., clk_i and clk_ib) to the serializer 304, but is not limited thereto. For example, the filtering circuit may correspond to a low-pass circuit for generating a static differential voltage 'vd' based on the duty cycle of the serializer 304's output signal, such that vd>0 for d>0.5 and vd<0 for d<0.5, but is not limited thereto. A polarity of the differential-voltage 'vd' represents the polarity of the skew such that vd>0, in case skew>0, and vd<0 if skew<0, but the example embodiments are not limited thereto, and other values and/or signs may be used. According to some example embodiments, the multi-phase clock signals correspond to a half-rate or a quarter-rate serializer-configuration, but the example embodiments are not limited thereto and other serializer configurations may be used. The multi-phase clock-driven serializer 304 is configured to receive a desired and/or pre-defined input data pattern through the multi-phase clock signals via edge-triggering, but is not limited thereto. The multi-phase serializer 304 senses the skew between the multi-phase clock signals and outputs a signal having a duty cycle 'd' which is proportional to the skew between the input clocks, such that, for example:

d>0.5 for skew>0 d<0.5 for skew<0

However, the example embodiments are not limited thereto, and other threshold values for the duty cycle d may be used. As mentioned before, skew may be defined as the time interval deviation (e.g., difference, etc.) between any two specified and/or edges of one or more clock signals. For example for clocks I and IB the Rise-Rise skew (e.g., rising edge to rising edge skew) can be defined as the deviation time interval from the rising edge of clock I to the rising edge of clock IB. Similarly, the Rise-Fall skew (e.g., rising edge to falling edge skew) can be defined as the deviation time interval from the rising edge of clock I to the falling edge of clock IB. However, the example embodiments are not limited thereto.

The serializer 304 (e.g., serializer circuit, serializer circuitry, etc.) is configured to iteratively calibrate a serializer output data interval to one unit interval (UI) based on the calibration of the multi-phase clock signals, and thereby enable a calibration (e.g., calibrate) of the serializer output within the data path. In another example, the filtering circuit may be directly fed multi-phase clock signals without the intervention of the serializer 304 to directly correct the skew in the multi-phase clock signals.

Further, the duty cycle detector circuitry 302 (e.g., duty cycle detector circuit, etc.) comprises a discrete time integrator (not shown) for amplifying the generated differential voltage. The discrete time integrator is used to integrate the differential voltage 'vd' from the filtering circuit (e.g., a low pass filter circuit, etc.) and thereby generate an amplified differential voltage with a desired and/or pre-defined gain and reduce the effective offset for processing by a comparator.

Figure 3B:

FIG. 3b illustrates a duty cycle comparator circuit within the duty cycle detector circuitry 302 for comparing the differential voltage with a desired and/or pre-defined value, e.g., 0, to thereby indicate a divergence of the differential voltage above and below the desired and/or pre-defined value, but the example embodiments are not limited thereto, and for example, the desired value may be any other value besides 0. According to at least one example embodiment, the comparator is an auto zero comparator circuit to compare the amplified differential voltage 'Vda' with a desired and/or pre-defined value 0 for detecting the duty cycle and thereby output 0 in case of, e.g., d<0.5, and 1 in case of d>0.5, but the example embodiments are not limited thereto and other values may be used.

Further, according to some example embodiments, the duty cycle detector circuitry 302 of FIG. 3a is further assisted by a skew corrector circuitry 306 (e.g., clock skew corrector circuit, etc.) to modify the rising edge and/or falling edge positions of multi-phase clock signals based on the detected indicated-divergence and trigger the serializer to output data in accordance with the modified and/or corrected clock signal(s). The skew corrector circuitry 306 is configured to modify and/or correct the skew between the clocks until the skew is decreased, improved, corrected, and/or at a minimum. The skew corrector circuitry 306 comprises a pull-up transistor configuration to adjust the rising edge of the input clock signal based on a first control voltage defined by the up code, and a pull-down transistor configured to adjust the falling edge of the input clock signal based on a second control voltage defined by the down code, and/or a cross coupled inverter configured to maintain a complementary nature of a multi-phase clock, but the example embodiments are not limited thereto.

To assist the operation of the skew corrector circuitry 306, a control generator 308 (e.g., control generator circuitry, etc.) defined by and/or executing program code corresponding to a Finite State Machine (FSM) is configured to generate first and second control signals denoted by a plurality of up and down codes to control, modify, and/or correct the skew of the multi-phase clock signals voltages based on the current comparator output. According to at least one example embodiment, the control generator 308 is configured in a negative feedback configuration to decrease and/or minimize skew between the clock phases, but the example embodiments are not limited thereto, and for example, may use other feedback configurations. The control generator 308 is configured for incrementing the upcode to cause a decrement of the duty-cycle until the output of the comparator is changed from 1 to 0, and decrements the downcode to cause an increment in the duty-cycle until the output of the comparator is changed from 0 to 1, but the example embodiments are not limited thereto. According to some example embodiments, the control generator 308 may be implemented using any processing circuitry capable of executing the FSM, etc. The processing circuitry may include hardware, such as processors, processor cores, logic circuits, etc.; a hardware/software combination such as at least one processor core executing software and/or executing any instruction set, etc.; or a combination thereof. For example, the processing circuitry more specifically may include, but is not limited to, a field programmable gate array (FPGA), a programmable logic unit, an application-specific integrated circuit (ASIC), a digital signal processor (DSP), a microcontroller, a system on chip (SoC), etc.

Figure 4:
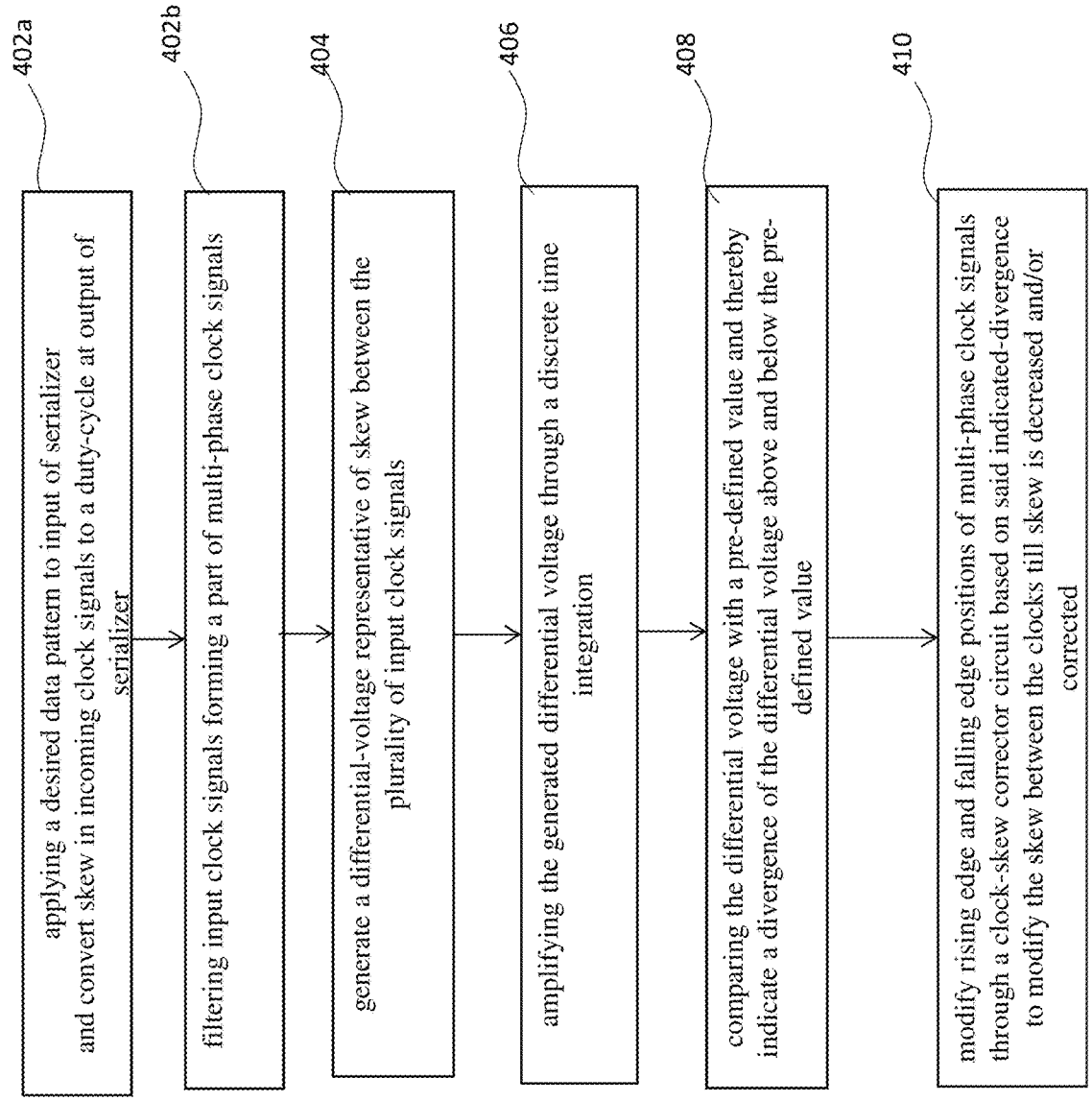
FIG. 4 illustrates a process for multi-phase clock skew-calibration in an electronic circuit comprising, in accordance with at least one example embodiment of the inventive concepts.

FIG. 4 illustrates a process for multi-phase clock skew-calibration in an electronic circuit comprising, in accordance with at least one example embodiment of the inventive concepts.

According to at least one example embodiment, the method comprises applying a desired and/or pre-defined data pattern as an input to a multi-phase clock-driven serializer to achieve (e.g., detect, determine, generate, etc.) clock-skew information at the data-output of the serializer. In other words, the skew is converted to duty cycle (operation 402a) based on the input multiphase clock signals. Thereafter, the method comprises filtering data output (operation 402b) of the multi-phase clock-driven serializer and/or multiphase clock signals. Further, the method comprises generating (operation 404) a differential-voltage representative of skew between the plurality of input clock signals to the serializer. The filtering circuit may correspond to a low-pass filter circuit for generating a static differential voltage 'vd' based on duty cycle of the serializer output signal, such that, e.g., vd>0 for d>0.5 and vd<0 for d<0.5, but the example embodiments are not limited thereto. The polarity of the differential-voltage 'vd' represents the polarity of the skew such that, e.g., vd>0, in case skew>0, and vd<0 if skew<0, but the example embodiments are not limited thereto. The multi-phase clock signals may correspond to a half-rate or a quarter-rate serializer-configuration, but are not limited thereto.

Further, the method comprises amplifying (operation 406) the generated differential voltage through a discrete time integration. A discrete time integrator is used to integrate the differential voltage 'vd' from the filtering circuit (e.g., a low pass filter circuit, etc.) and thereby generate an amplified differential voltage with a desired and/or pre-defined gain and reduce effective offset for processing by a comparator.

Further, the method comprises comparing (operation 408) the differential voltage with a desired and/or pre-defined value and thereby indicate a divergence of the differential voltage above and below the desired and/or pre-defined value. The comparator may be an auto zero comparator circuit to compare the amplified differential voltage 'Vda' with a desired and/or pre-defined value 0 for detecting the duty cycle and thereby output 0 in case of d<0.5, and 1 in case of d>0.5, but the example embodiments are not limited thereto.

Further, the method comprises modifying (operation 410) the rising edge and/or falling edge positions of the multi-phase clock signals through clock-skew corrector circuitry based on the indicated-divergence. Clock-skew corrector circuitry is provided to modify the rising edge and falling edge positions of the multi-phase clock signals based on the indicated-divergence and triggers the serializer to output data in accordance with modified clock.

Further, the method comprises triggering (operation 410) the serializer to output data in accordance with the modified clock, wherein the clock-skew corrector circuitry is configured to modify (operation 410) the skew between the clocks until the skew is decreased and/or at a minimum.

Figure 5A:
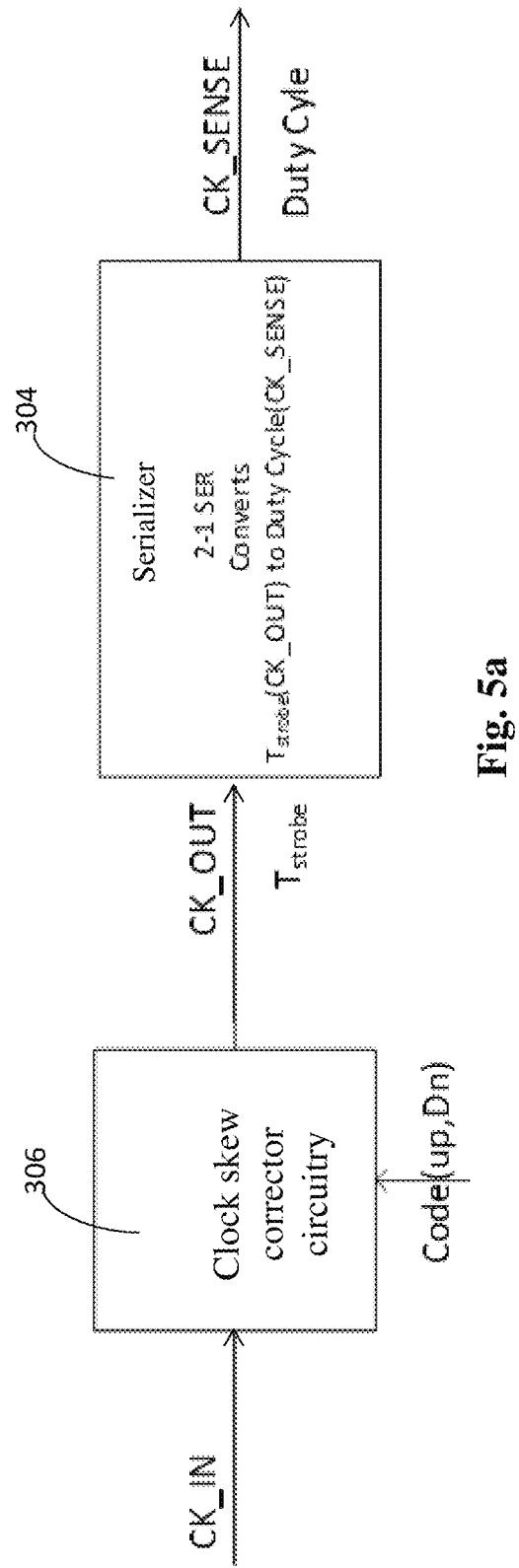
FIGS. 5A to 5B illustrate a calibration loop based on the circuit to correct skew of clocks, in accordance with at least one example embodiment of the inventive concepts.

FIG. 5a illustrates a calibration loop based on the circuit 300 to correct the skew of clocks (e.g., clock signals), wherein the data-path is calibrated directly instead of calibrating the clock path to reduce the detected clock skew. On the other hand, the state of the art solutions calibrate clock signals which leaves a small error in the data interval and thereby the data interval achieved is not equivalent to one UI.

Figure 5B:
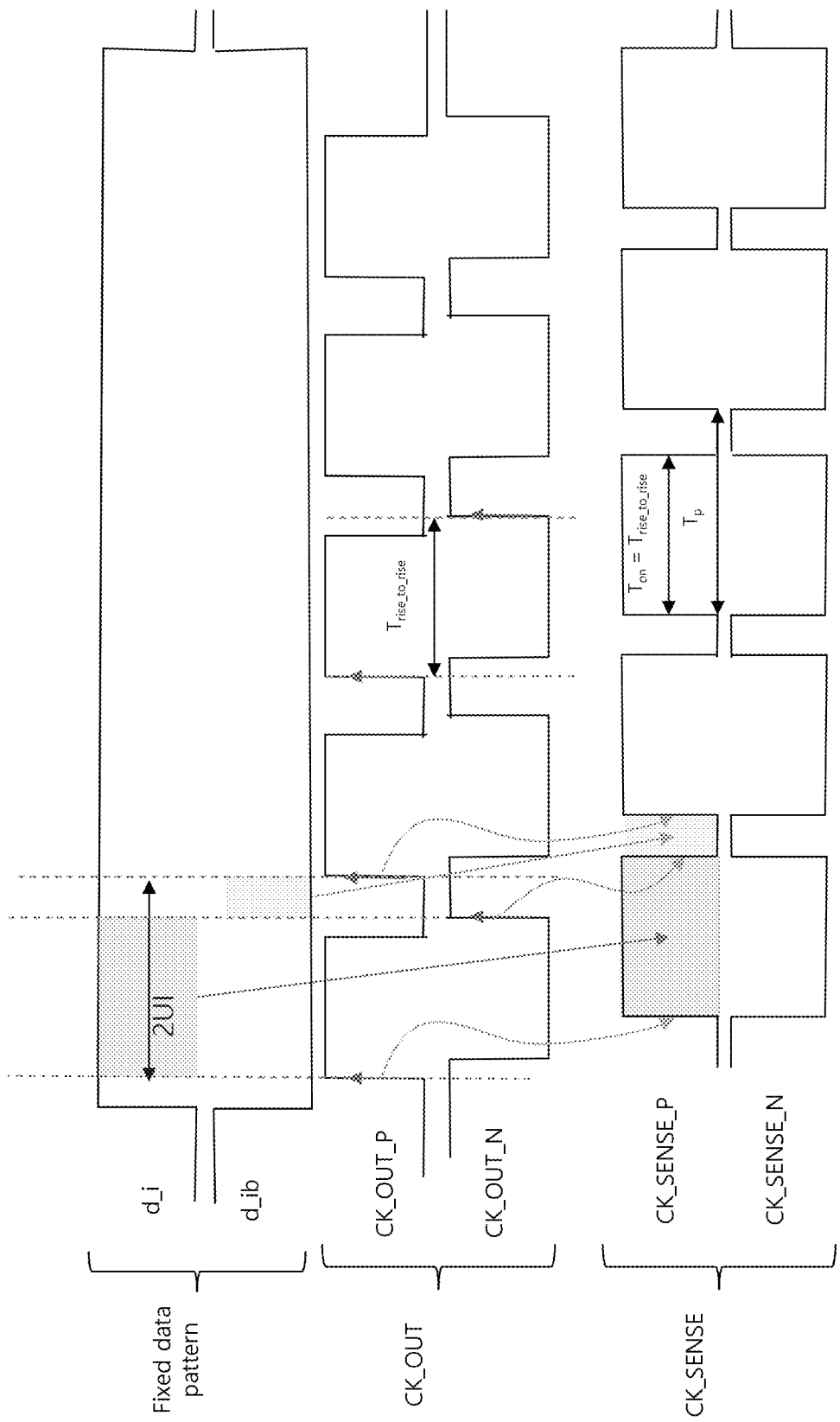

FIG. 5b illustrates a timing diagram based operation of the calibration loop during the start of calibration when the skew is not decreased and/or at a minimum according to at least one example embodiment.

More specifically, after the clock skew calibration is completed, the CK_SENSE output is used as the serializer 304's output, whose input is d_i and d_ib. The calibrated clock signals driving the serializer 304 are represented by CK_OUT.

The data patterns d_i and d_ib representing data input may be a digital pattern (e.g., 1's and 0's) and may resemble and/or correspond to the clock signal. The Data Input is timed to the serializer 304, so during a high level of CK_OUT_P, d_i has no transition, and during a high level of CK_OUT_N, d_ib has no transition. Accordingly, on a rising edge of CK_OUT_P, d_i is transferred to CK_SENSE_P, and on a rising edge of CK_OUT_N, d_ib is transferred to CK_SENSE_N. CK_SENSE may be sensitive to the rising edges of CK_OUT_P/N.

For CK_SENSE, Duty Cycle of CK_SENSE is a measure of $T_{rise\_to\_rise}$.

In other words, Duty Cycle=T_on/T_p=T_(rise_to_rise)/ T_p

At the end of calibration, $T_{on}=T_{rise\_to\_rise}$=UI (unit interval), wherein UI=1/(Data rate).

Hence the serializer output data interval is calibrated to one unit interval, the clock gets calibrated to a value that makes data unit interval equal to one UI. This obviates the drawback of conventional art solutions wherein despite calibrating the ON period and OFF period the clock (CK_OUT) to unit interval, the serializer output data interval (i.e. CK_SENSE interval) would still have a small error.

Figure 6:
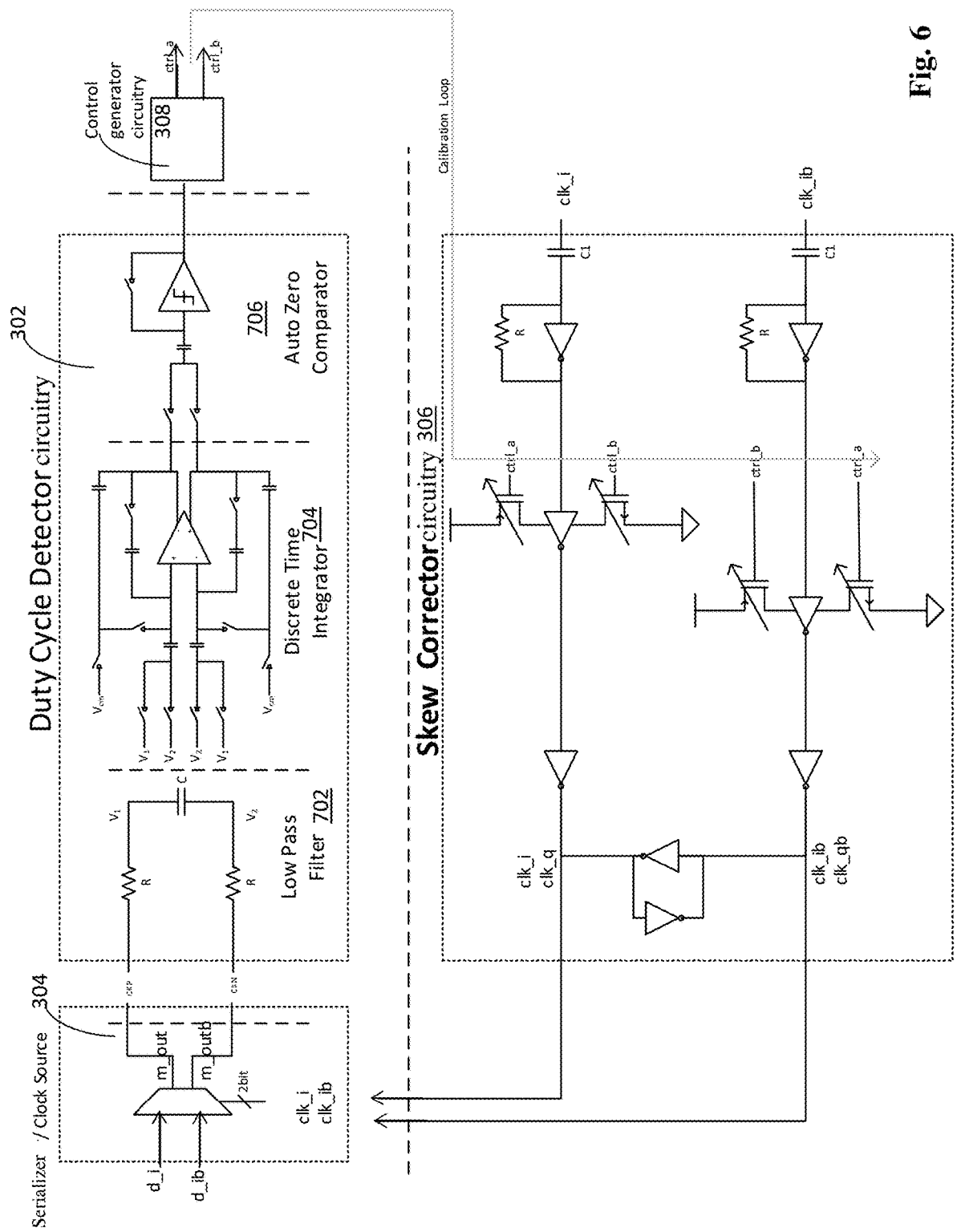
FIG. 6 illustrates a Half Rate Calibration in accordance with at least one example embodiment of the inventive concepts.

FIG. 6 illustrates a half rate calibration circuitry in accordance with at least one example embodiment of the inventive concepts. More specifically, the half rate calibration circuitry comprises providing an amplifier 704 with high gain ($A_v$) before a comparator 706 to reduce the effective input referred offset by the factor of gain (Av).

The conventional art solutions achieve a high gain using multiple stages of amplifiers, and therefore expend higher power and have less energy efficiency, and occupy a significantly larger physical area due to larger components and/or requiring more components. Moreover, the amplifiers employed in the conventional art has its own offset which is too large to be ignored and limits the lowest achievable effective comparator input offset.

Moreover, the conventional art solution with multi-stage amplifiers for achieving high gain require more components in the system adding noise to the output, thereby limiting the detection accuracy of the system.

The present employment of a discrete time integrator 704 within the circuit 300 in at least one example embodiment, in place of an amplifier as used in the conventional art circuits, at least achieves a higher gain akin to (e.g., similar to) the use of multiple stage amplifiers as the input may be integrated for number of cycles. In an example, for a given power and area, the maximum achievable gain (Av) can be set to infinity, and hence the minimum achievable offset is zero. Moreover, the noise at the output is substantially less, thereby augmenting accuracy.

Further, according to some example embodiments, the comparator forming a part of the circuit 300 is a differential auto zero comparator 706 to improve the duty cycle detection accuracy of the clock skew in terms of differential voltage vd as also discussed with reference to FIG. 3b. The use of the discrete time integrator 704 as a gain stage, relaxes the specification of the succeeding auto zero comparator 706. This at least overcomes the smallest detectable skew limitation of the conventional art calibration circuits, and improves the residual skew performance metric of calibration.

Figure 7:
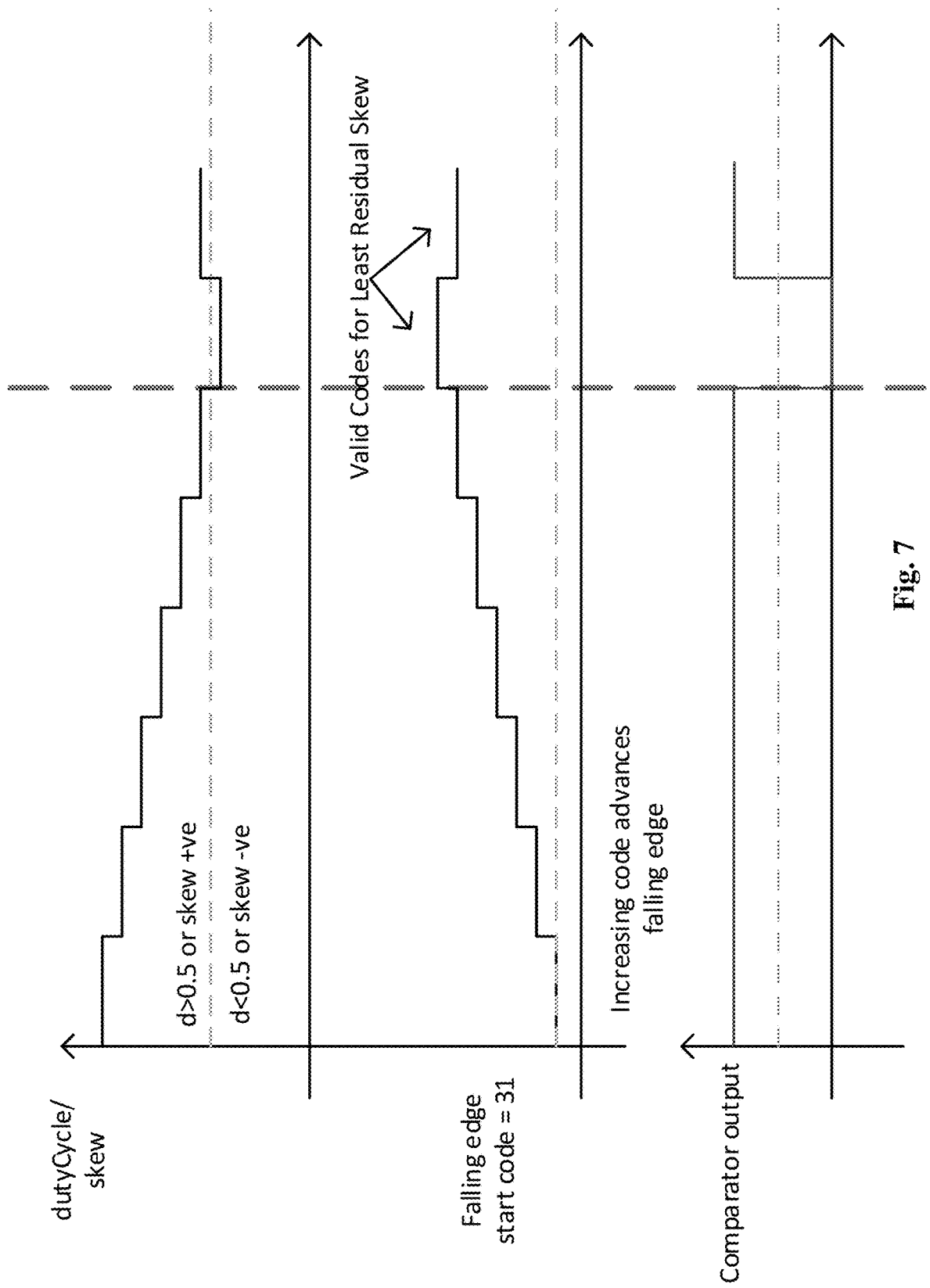
FIG. 7 illustrates an operation of a control generator, in accordance with at least one example embodiment of the inventive concepts.

FIG. 7 illustrates an operation of a control generator 308. The Finite State Machine (FSM) 308 (and/or the control generator circuitry executing the FSM 308) is configured to generate first and second control signals denoted by a plurality of up and down codes to control skew of the multi-phase clock signals voltages based on the current comparator output. The control generator 308 is configured in a negative feedback configuration to decrease and/or minimize skew between the clock phases and the control generator 308 by incrementing the upcode to cause the decrement of the duty-cycle until the change in the output of the comparator from a first level and/or value (e.g., 1) to a second level and/or value (e.g., 0), and decrementing the downcode to cause the increment of the duty-cycle until the change in the output of the comparator from the second level and/or value (e.g., 0) to the first value (e.g., 1), but the example embodiments are not limited thereto.

Overall, increasing the code (represented as a staircase waveform) reduces the duty cycle d in order to enable the duty cycle d to approach the value of, e.g., 0.5, but the example embodiments are not limited thereto. During this time the skew is 'positive' as sensed by the comparator 706, but is not limited thereto. When the duty cycle has reached 0.5, further incrementing of the code changes the polarity of the skew to 'negative' (as sensed by comparator 706) and leads to the duty cycle falling lower than 0.5. At this moment, a further incremented and/or increased code leads to again a change of polarity of the skew back to positive, and the duty cycle d hovers close to 0.5, etc. Such value of code represents a valid code value for a decreased, least, and/or minimized residual skew.

The aforesaid example operation represents a scenario of an initial positive skew and accordingly an operation of the upcode, but the example embodiments are not limited thereto. The same may expanded to cover scenario of an initial negative skew and accordingly an operation of downcode.

Figure 8B:
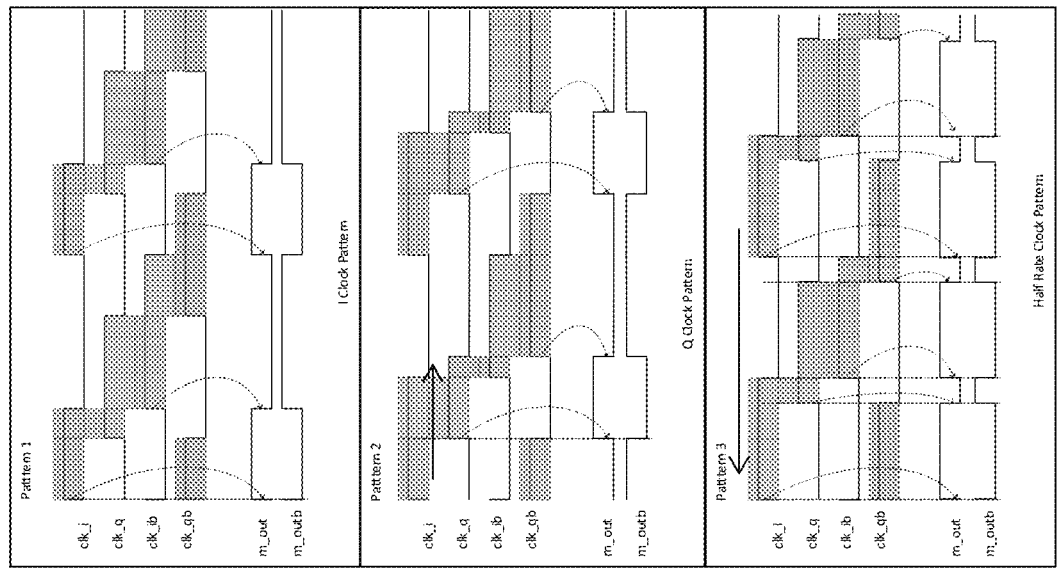
FIGS. 8A to 8B an example method of operation for quarter rate architecture, in accordance with at least one example embodiment of the inventive concepts.
Figure 8A:
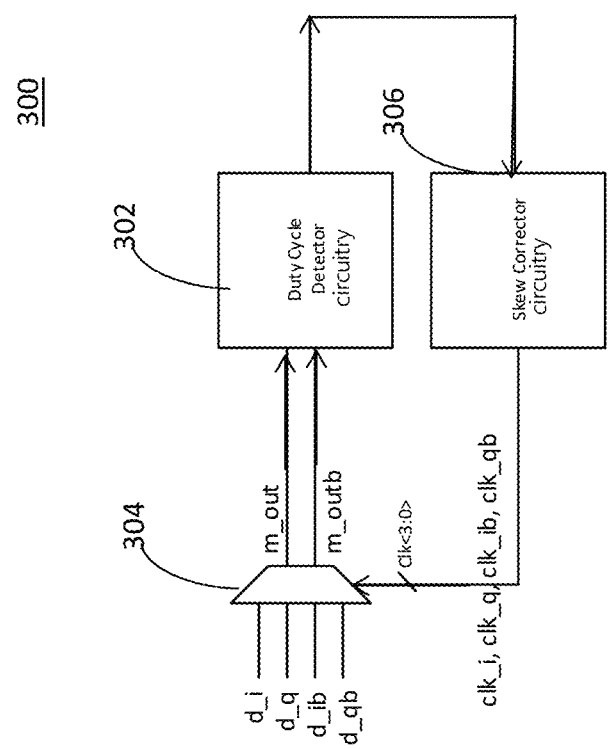

FIGS. 8A to 8B illustrate an example method of operation for quarter rate architecture, in accordance with at least one example embodiment of the inventive concepts. More specifically, some example embodiments of the inventive concepts may be appropriated for multi-phase clock skew calibration for a quarter rate architecture by changing a data pattern, thereby not desiring and/or requiring additional hardware components, and merely relying on a changed data pattern. FIG. 8a represents the quarter rate configuration while FIG. 8b represents a method of operation of clock skew calibration based on a data pattern as depicted in Table 1 according to some example embodiments.

TABLE 1

| Data | Pattern 1 | Pattern 2 | Pattern 3 |
| --- | --- | --- | --- |
| d_i | 0 | 0 | 1 |
| d_q | 0 | 1 | 0 |
| d_ib | 1 | 1 | 1 |
| d_qb | 1 | 0 | 0 |

The example sequence of application of data pattern 1, 2 and 3 may be as follows:
1. Apply Data Pattern 1→creates I Clock pattern in mux_out/outb lines
    ON Period of (I Clock Pattern)=2UI+I_IB rise-rise skew
    Detect duty Cycle of Clocks I and IB and Correct it to 50%
    Making bit period of (d_i)+bit period of (d_q)=2UI
2. Apply Data Pattern 2→creates Q Clock pattern in mux_out/outb lines
    ON Period of (Q Clock Pattern)=2UI+Q_QB rise-rise skew
    Detect duty Cycle of Clocks Q and QB and Correct it to 50%
    Making bit period of (d_q)+bit period of (d_ib)=2UI
3. Apply Data Pattern 3→creates half rate Clock pattern in mux_out/outb lines
    Half rate Clock ON Period=1UI+I_Q rise-rise skew
    Skew between I and Q Clocks will create duty cycle distortion in half rate Clock
    Detect duty Cycle of half rate clock and Correct it to 50%
    Correction is done by adjusting skew of Q & QB with respect I & IB
    Half rate Clock duty cycle=50%
        Makes bit period of (d_i)=1UI=bit period of (d_q) &
        Makes bit period of (d_ib)=1UI=bit period of (d_qb)

At least in view of the aforesaid features, various example embodiments of the inventive concepts achieve low power low speed sub blocks as the duty cycle error is converted to DC voltage. The usage of a differential integrator decreases and/or eliminates error in the residual skew due to circuit non-idealities like offset and noise. Further, voltage and/or temperature drift of the circuit may be tracked.

Moreover, the employment of discrete time architecture is chosen such that accumulated error $\Delta_{accError}$ after multiple cycles of integration is very small, e.g., close to zero, etc. Further, the number of steps of integration N may be made large without expending and/or requiring much power consumption by the calibration circuit of the example embodiments in comparison to calibration circuits of the conventional art. Accordingly, the comparator error component ($\Delta$Comparator_error)/N$\delta$ may be achieved close to zero. Furthermore, as the low pass filter (LPF) design is decoupled from amplifier, hence the LPF design is made simple and/or independent, and a higher order filter can be used to decrease and/or minimize error due to a ripple effect (i.e. $\Delta$LPF_error is made close to zero). Last but not the least, the calibration process may be expedited by increasing power by a small amount and/or factor.

While specific language has been used to describe various example embodiments of the inventive concepts, any limitations arising on account thereto, are not intended. As would be apparent to a person in the art, various working modifications may be made to the example embodiments in order to implement the inventive concepts as taught herein. The drawings and the foregoing description give examples of at least one example embodiment. Those skilled in the art will appreciate that one or more of the described elements may well be combined into a single functional element. Alternatively, certain elements may be split into multiple functional elements. Elements from one example embodiment may be added to another example embodiment.

We claim:
1. An electronic circuit for multi-phase clock skew calibration comprising:
    a filtering circuit configured to filter data output by multi-phase clock-driven serializer circuitry, and generate a differential voltage representative of skew between a plurality of input multi-phase clock signals to the serializer circuitry, wherein a polarity of the differential voltage represents the polarity of skew of the multi-phase clock signals;
    discrete time integrator circuitry configured to amplify the generated differential voltage;
    comparator circuitry configured to determine a divergence of the differential voltage based on the differential voltage and a desired value; and
    clock-skew corrector circuitry configured to,
        modify rising edge or falling edge positions of the plurality of multi-phase clock signals based on the determined divergence, trigger the serializer circuitry to output data in accordance with the modified plurality of multi-phase clock signals, and decrease the skew between the plurality of multi-phase clock signals.

2. The electronic circuit as claimed in claim 1, wherein the plurality of multi-phase clock signals correspond to a half-rate or a quarter-rate serializer-configuration.

3. The electronic circuit as claimed in claim 1, wherein the multi-phase clock-driven serializer circuitry is configured to:

receive a desired input data pattern through the plurality of multi-phase clock signals via edge-triggering;

sense the skew between the plurality of multi-phase clock signals;

output a signal having a duty cycle proportional to the skew between the plurality of multi-phase clock signals; and iteratively calibrate an interval of the output data of the serializer circuitry to one unit interval based on the calibration of the plurality of multi-phase clock signals and thereby enable calibration within a datapath of the electronic circuit.

4. The electronic circuit as claimed in claim 3, wherein the filtering circuit includes a low pass circuit configured to generate the differential voltage based on a duty cycle of the output data of the serializer circuitry, wherein the generated differential voltage is a static differential voltage.

5. The electronic circuit as claimed in claim 1, wherein the discrete time integrator circuitry is configured to:

integrate the differential voltage from a low pass filter circuit; and generate the amplified differential voltage with a desired gain and decreased effective offset based on results of the integration; and transmit the amplified differential voltage to the comparator circuitry.

6. The electronic circuit as claimed in claim 1, wherein the comparator circuitry includes an auto-zero comparator circuit configured to compare the amplified differential voltage with a desired value for detecting a duty cycle.

7. The electronic circuit as claimed in claim 1, further comprising:

control generator circuitry configured to execute a Finite State Machine (FSM) to generate control signals based on output of the comparator circuitry, the control signals denoted by a plurality of up and down codes, the control signals controlling the skew of the plurality of multi-phase clock signals.

8. The electronic circuit as claimed in claim 1, wherein the clock-skew corrector circuitry comprises:

a pull-up transistor configured to adjust the rising edge of at least one clock signal of the plurality of multi-phase clock signals based on a first control voltage defined by the up code;

a pull-down transistor configured to adjust the falling edge of the at least one clock signal of the plurality of multi-phase clock signals based on a second control voltage defined by the down code; and a cross coupled inverter configured to maintain a complementary nature of the plurality of multi-phase clock signals.

9. The electronic circuit as claimed in claim 1, further comprising:

control generator circuitry configured in a negative feedback configuration to:

decrease skew between clock phases of the plurality of multi-phase clock signals;

increment upcode to cause decrementing of a duty cycle until the output of the comparator circuitry changes from a first level to a second level; and decrement downcode to cause incrementing of a duty cycle until the output of the comparator circuitry changes from the second level to the first level.

10. An electronic circuit for multi-phase clock skew-calibration comprising:

a filtering circuit configured to filter a plurality of multi-phase clock signals, and generate a differential voltage representative of skew between the plurality of multi-phase clock signals;

discrete time integrator circuitry configured to amplify the generated differential voltage;

comparator circuitry configured to determine a divergence of the differential voltage based on the differential voltage and a desired value; and clock-skew corrector circuitry configured to modify rising edge or falling edge positions of the plurality of multi-phase clock signals based on the determined divergence, and decrease the skew between the plurality of multi-phase clock signals.

11. A process for multi-phase clock skew-calibration in an electronic circuit comprising:

applying a desired data pattern as input to a multi-phase clock-driven serializer circuitry to determine clock skew information;

filtering data output by the multi-phase clock-driven serializer circuitry;

generating a differential voltage representative of skew between a plurality of multi-phase clock signals input to the multi-phase clock-driven serializer circuitry;

amplifying the generated differential voltage through a discrete time integration;

determining a divergence of the differential voltage based on the differential voltage and a desired value;

modifying rising edge and falling edge positions of at least one of the plurality of multi-phase clock signals through clock-skew corrector circuitry based on the determined divergence to decrease the skew between the plurality of clock signals; and triggering the multi-phase clock-driven serializer circuitry to output data in accordance with the modified at least one clock signal.

12. The process for multi-phase clock skew-calibration in the electronic circuit as claimed in claim 11, wherein the plurality of multi-phase clock signals correspond to a half-rate or a quarter-rate serializer-configuration.

13. The process for multi-phase clock skew-calibration in the electronic circuit as claimed in claim 11, further comprising:

receiving the desired input data pattern through the plurality of multi-phase clock signals via edge-triggering through the multi-phase clock-driven serializer circuitry;

sensing the skew between the plurality of multi-phase clock signals through the multi-phase clock-driven serializer circuitry;

outputting a signal having a duty cycle proportional to the skew between the plurality of multi-phase clock signals through the multi-phase clock-driven serializer circuitry; and iteratively calibrating an interval of the output data of the serializer circuitry to one unit interval based on the calibration of the plurality of multi-phase clock signals and thereby enabling calibration within a datapath of the electronic circuit through the multi-phase clock-driven serializer circuitry.

14. The process for multi-phase clock skew-calibration in the electronic circuit as claimed in claim 13, further comprising:
generating the differential voltage based on a duty cycle of the output data of the serializer circuitry using a low pass circuit.

15. The process for multi-phase clock skew-calibration in the electronic circuit as claimed in claim 14, wherein the generated differential voltage is a static differential voltage.

16. The process for multi-phase clock skew-calibration in the electronic circuit as claimed in claim 11, further comprising:
integrating the differential voltage from a low pass filter circuit through a discrete time integrator circuitry;
generating the amplified differential voltage with a desired gain and decreased effective offset based on results of the integration through the discrete time integrator circuitry; and
transmitting the amplified differential voltage to comparator circuitry.

17. The process for multi-phase clock skew-calibration in the electronic circuit as claimed in claim 11, further comprising:
comparing the amplified differential voltage with a desired value for detecting duty cycle using an auto-zero comparator circuit.

18. The process for multi-phase clock skew-calibration in the electronic circuit as claimed in claim 11, further comprising:
executing a Finite State Machine (FSM) to generate control signals based on output of a comparator circuitry, the control signals denoted by a plurality of up and down codes, the control signals controlling the skew of the plurality of multi-phase clock signals through a control generator circuitry.

19. The process for multi-phase clock skew-calibration in the electronic circuit as claimed in claim 11, further comprising:
adjusting the rising edge of at least one clock signal of the plurality of multi-phase clock signals based on a first control voltage defined by the up code using a pull-up transistor;
adjusting the falling edge of the at least one clock signal of the plurality of multi-phase clock signals based on a second control voltage defined by the down code using a pull-down transistor; and
maintaining a complementary nature of the plurality of multi-phase clock signals using a cross coupled inverter.

20. The process for multi-phase clock skew-calibration in the electronic circuit as claimed in claim 11, further comprising:
decreasing skew between clock phases of the plurality of multi-phase clock signals through control generator circuitry;
incrementing upcode to cause decrementing of a duty cycle until the output of the comparator circuitry changes from a first level to a second level through the control generator circuitry; and
decrementing downcode to cause incrementing of the duty cycle until the output of comparator circuitry changes from the second level to the first level through the control generator circuitry.

* * * * *